United States Patent [19]
Riley

[11] 4,255,750
[45] Mar. 10, 1981

[54] MULTIPLE CELL ELECTROMAGNETIC RADIATION TEST SYSTEM

[76] Inventor: Leon H. Riley, 7707 Logan Dr., SW., Huntsville, Ala. 35802

[21] Appl. No.: 50,007

[22] Filed: Jun. 18, 1979

[51] Int. Cl.³ .............................................. G01R 29/08
[52] U.S. Cl. ................................. 343/703; 324/58.5 B
[58] Field of Search ...................... 324/58.5 R, 58.5 A, 324/58.5 B, 58.5 C; 333/128, 238; 343/703

[56] References Cited

U.S. PATENT DOCUMENTS

| | | | |
|---|---|---|---|
| 3,663,783 | 5/1972 | McKague et al. | 219/10.55 |
| 3,706,498 | 12/1972 | Peacher | 356/121 |

Primary Examiner—Eli Lieberman
Attorney, Agent, or Firm—Nathan Edelberg; Robert P. Gibson; Freddie M. Bush

[57] ABSTRACT

A multiple cell electromagnetic radiation testing system includes a plurality of isolated strip transmission line cells coupled in electrical series and having aligned apertures in the walls of the cells. With this arrangement the respective cells bounded waves add to simulate application of a single electromagnetic radiation field at test specimens located in the apertures of the cell walls. Each cell has a plate-to-plate dimension that is small compared to a wavelength of the highest test frequency. The phase and arrival time of each cell voltage is controlled to simulate electromagnetic radiation impingement of the test sample at selected angles.

8 Claims, 4 Drawing Figures ll
MULTIPLE CELL ELECTROMAGNETIC RADIATION TEST SYSTEM

DEDICATORY CLAUSE

The invention described herein may be manufactured, used, and licensed by or for the Government for governmental purposes without the payment to me of any royalties thereon.

BACKGROUND OF THE INVENTION

Electromagnetic radiation (EMR) testing is presently hampered by reflections and resonances in the single testing chamber. Electromagnetic interference (EMI) from outside the chamber also occurs. A typical conventional test chamber can include a transmitter and antenna for directing electromagnetic radiation across a space toward a test specimen rotatably mounted. The rotatable specimen is normally moved to a test position and stopped for each test. Depending on the size of the specimen, such as a missile, tank, or other structure which may house equipment affected by EMR, such as electronic circuits, the space required for rotatably testing may be a limiting factor. For a missile, the longitudinal axis of the test specimen is positioned at some variable angle B with respect to the EMR propagation direction. This is done by support assembly and rotating table. Testing which must be done at outdoor, unshielded facilities are also subject to EMI.

The effect of impinging EMR on missile systems such as the guidance and control systems within a missile housing may be detected or maintained in several ways during testing. An antenna may be placed inside the test specimen housing to pick up the radiation pattern developed. This detected radiation may then be coupled out to monitoring detector equipment. Fiber optics may be utilized to monitor guidance and control telemetry to determine radiation effects. If the specimen is food to be cooked or involves a chemical curing process or sterilizing of equipment, a pickoff or detector is unnecessary.

Present EMR radiated susceptibility testing of electronic equipment is normally conducted in an electromagnetic shielded enclosure. The EMR is launched from an antenna to the test item but reflections in the enclosure (from the enclosure walls and other test support hardware) cause serious perturbation in the EMR fields. Chambers are lined with EMR absorbing material to reduce reflections. This material (sometimes referred to as anechoic) is expensive and partially effective.

SUMMARY OF THE INVENTION

In the multiple cell electromagnetic radiation test system a plurality of strip transmission line cells are coupled in physical and electrical series for providing EMR field steering by electronics phase shifting. Apertures in the walls of the cells provide a space for test specimens to be inserted into the cell system. This arrangement allows a fixed or unmoved test specimen to be subjected to EMR radiation fields that have previously required rotation or repositioning of the specimens. The phase and arrival time of each cell voltage is controlled to provide the same EMR impingement of the test sample as would have been provided with a rotatable table system at selected angles of rotation with respect to a reference position. Each cell of the system may be electrically isolated from adacent cells by gas or fluid driven electric generators and fiber optics.

DESCRIPTION OF THE PREFERRED EMBODIMENT

Figure 1:
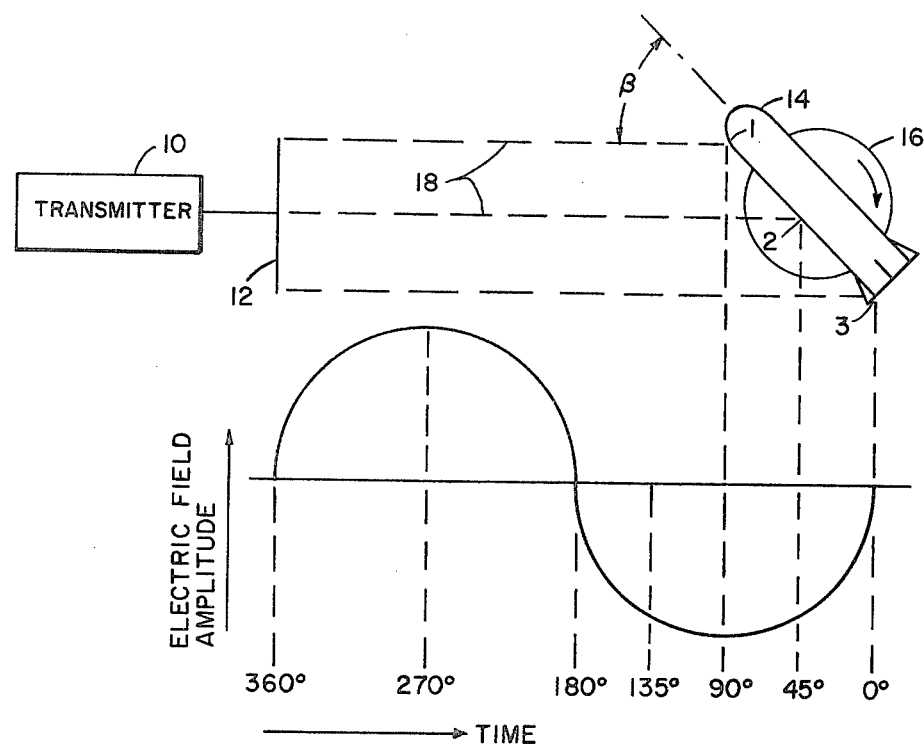
FIG. 1 is a plan view of a system providing conventional electromagnetic radiation of a test specimen, showing illustrative phase variation at the specimen.

Referring now to the drawings wherein like numerials refer to like parts in the several Figures, FIG. 1 discloses a typical prior art test system. A transmitter 10 is disposed for supplying electromagnetic radiation (EMR) at a preselected frequency to antenna 12. A test specimen such as a missile 14 is disposed on a rotatable table 16 in the path of electromagnetic radiation 18 from antenna 12. The longitudinal axis of missile 14 is aligned at some variable angle B with respect to the EMR on a normal to the antenna emitting surface. For a fixed position of the antenna and the specimen and a particular frequency of radiation, a unit area of the specimen will always be subjected to the same degree of radiation as shown in the typical electric field amplitude curve of FIG. 1. Three points on the missile (1, 2, and 3) are at the respective nose, center, and tail sections. EMR arrives at (1) before (2), and at (2) before (3). For example, when the EMR arriving at point (3) has a phase of 0° the EMR arriving at (2) is 45° out of phase with (3) and similarly 90° out of phase with point (1). As the radiation wave continuously impinges on the fixed missile, each point continuously receives radiation which differs in phase. To change the radiation impingiment angle on the specimen, it must be rotated to a new B position. Thus, in testing a missile for response during radiation or for adverse effects of radiation thereon, the missile must be maneuvered through considerable positions to supply radiant energy to each per unit area of the missile or area of interest. This results in cumbersome support equipment and positioners, especially for larger specimens.

Figure 2:
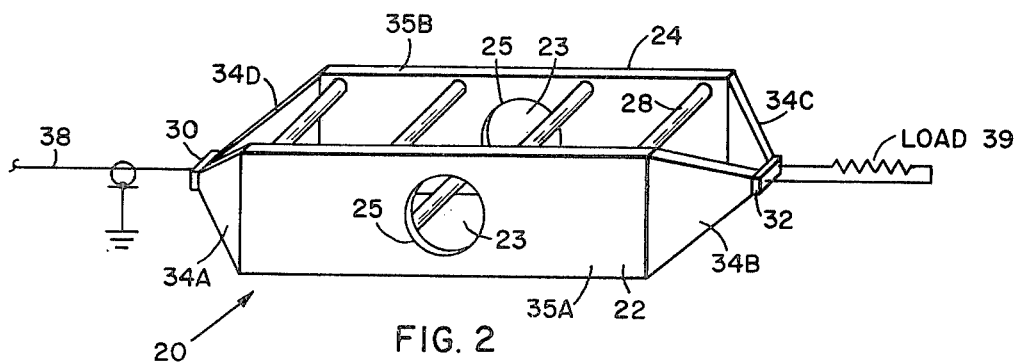
FIG. 2 is a diagrammatic view of a single strip transmission line cell having apertured walls and input-output connections shown in schematic form.

The multiple cell test system provides capability for phase shift at each cell to simulate the wave arriving from angles other than broadside (B=90°). Broadside testing can be accomplished without phase shift between cells. FIG. 2 shows a single cell 20 having apertured, metal walls. Walls 22 and 24 each have respective apertures 23 coaxially therethrough. The edge or surface of each aperture may be coated with an insulating material 25 to prevent conduction between the walls 22, 24 and a test specimen inserted in the aperture. The space between walls may be air or dielectric; or dielectric support rods 28 may be utilized, maintaining the spacing and characteristic impedance between walls of each cell. At the respective feed input end 30 and load end 32 of each cell, the respective walls taper down and converge toward a common point to maintain the desired characteristic impedance common in strip line structures. The spacing between walls 22 and 24 is small compared to the wavelength of the test frequency. In construction the tapered surfaces 34A-D increase as the distance away from terminals 30 and 32 increase and the space between adjacent surfaces increases so that the characteristic impedance remains constant. Parallel wall portions 35A and 35B interconnects the respective tapered portions 34, maintaining characteristic impedance therebetween. In applying EMR to a specimen within the cell 20, radio frequency energy is supplied, as by a strip transmission line or coaxial cable 38 to input 30 and is dissipated in load 39.

Figure 3:
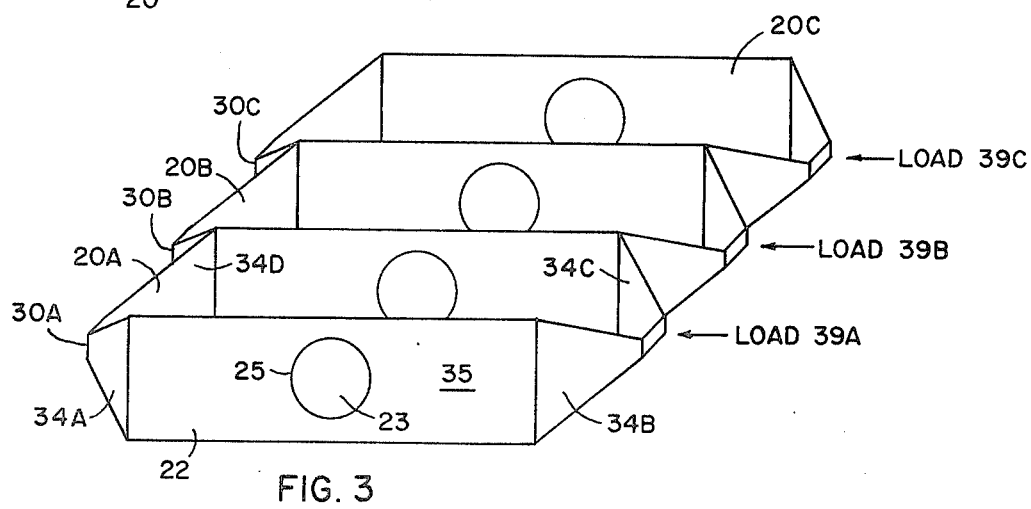
FIG. 3 is a diagrammatic view of several cells having coaxial apertured walls for receiving test specimens.

FIG. 3 discloses several test cells 20A, 20B, and 20C. Each cell 20 has a separate input and load. Each cell may be individually constructed with respective interior walls joined together or may be constructed sharing a common wall with adjacent cells. Each cell is a strip transmission line for providing electrical matching of the feed diverging plates 34A and 34D, the rectangular cell plates 35, the converging plates 34B and 34C and the load to the input characteristic impedance.

Figure 4:
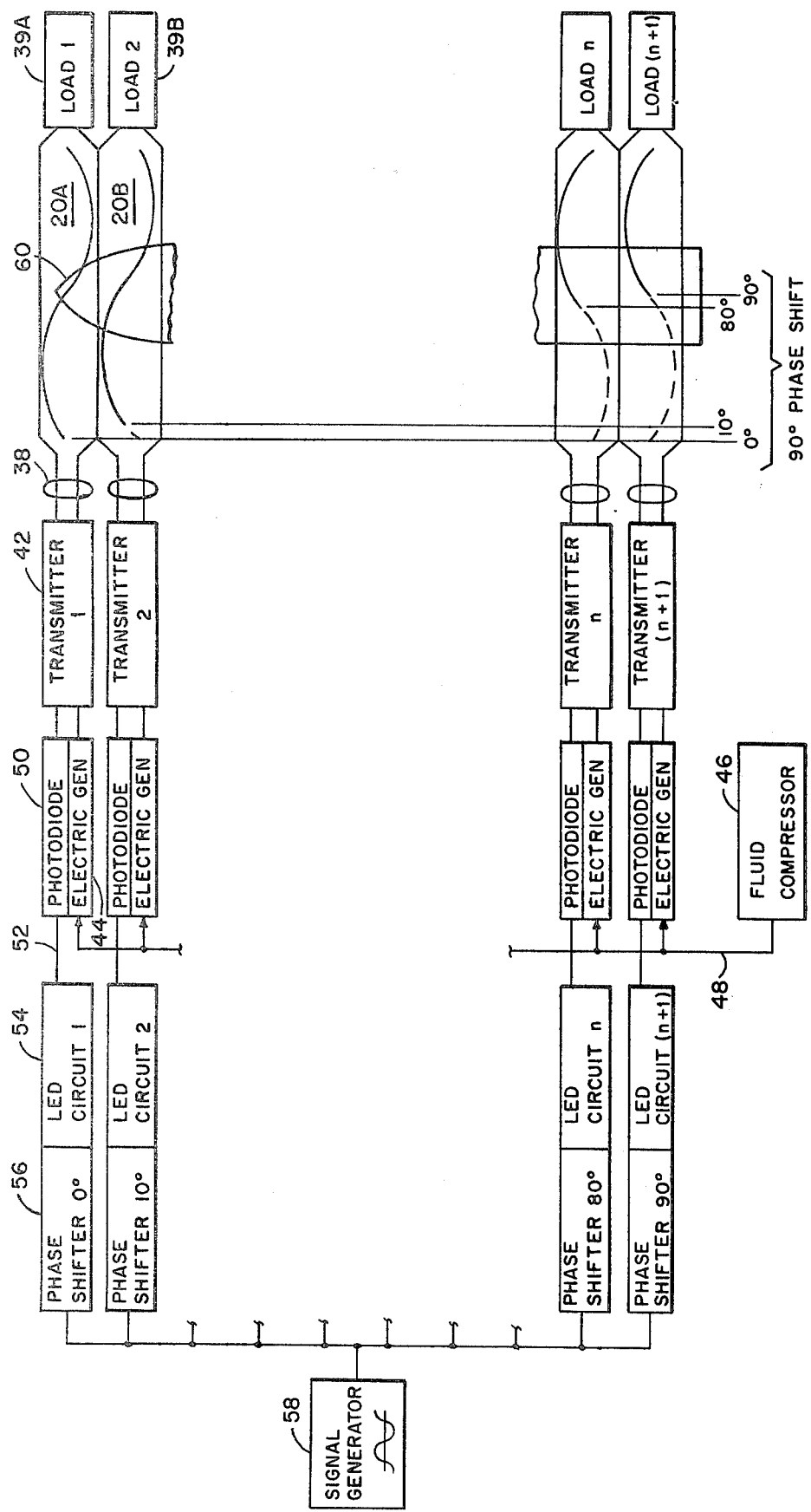
FIG. 4 is a block diagram of a preferred multiple cell EMR test system.

FIG. 4 discloses a block diagram of a typical multiple cell test system. Typically each cell 20 has a load 39 and is coupled through a transmission line 38 to a transmitter 42. Transmitter 42 is powered by an electronic generator 44 driven by a gas or fluid compressor 46 coupled to generator 44 with non-conductive tubing 48 to provide isolation between cells. Alternatively, the transmitter may be driven by light from photovoltaic cells via light pipes instead of tubing 48 (not shown). Each transmitter 42 is further coupled back through a photodiode circuit 50, non-conductive fiber optics 52, a light emitting diode circuit 54, and a phase shifter 56 to a common signal generator 58. Alternatively, the signal generator 58 can be coupled directly to LED circuit 54 and the phase shifter 56 placed between transmitter 42 and cell 20.

In operation, a test specimen 60 is placed into the cell apertures for testing. The energy associated with these fractional wavelength cells adds to provide the test EMR fields through the test specimen 60. The signal generator 58 output is divided into separate signals for each cell. The signal to each cell can be the same phase or can be shifted in phase by phase shifters 56 to provide the capability of varying the relative phase and electric energy arrival time at each cell. These delays or phase shifts provide illumination of test specimens at varying illumination angles. The variation in phase between cells simulates EMR arriving at a positionable test specimen from a distance source at varying angles. Thus, for a typical arrangement of 10 cells fed from 10 phase shifters, each having 10° shift from the adjacent cell, a phase shift of from 0° at the first cell to 90° at the last cell occurs. A typical wave for each cell is shown developed across specimen 60, having a phase shift from 0° to 90° over a 10 cell system. The developed phase shift in each cell may be variable, changing the EMR impinging on the specimen over a given area.

The effect of such EMR on the test specimen 60 is evidenced in any of several ways. For example the various systems and electronic circuits may subsequently be removed from the test cells and tested for any characteristic response changes. Also, the specimen 60 may have an antenna therein, such as within a missile housing, coupled to recording circuitry for receiving and recording the EMR intensity passing through the housing. Where the test specimen involves curing a chemical process, cooking foods, or equipment sterilization an indicator of temperature, or processing time may be employed and no EMR pickoff required.

The light emitting diode, fiber optic, and photodiode converter circuitry together with the electrically isolated generator for the amplifier transmitter provides substantial electrical isolation. The photodiode 50 converters provide an electric signal output to each cell 20, which is identical to the phase shifter output 56 used to drive LED 54. The location of phase shifter 56 at the signal generator provides for phase shifts and delays being done at a low voltage for amplification at each cell. The amplified signal from transmitters 42 are transmitted through each cell into the respective loads, while the electromagnetic radiation developed within each cell are joined as a wavefront as a result of the cell interconnection. This wavefront induced into the test specimen simulates that which would be induced in it if the specimen were located in free space. The characteristic impedance of each cell is electrically matched to the amplifier and each cell is terminated in its characteristic impedance load, thereby preventing reflections in the cells.

Each cell provides a characteristic impedance match to the transmitter that energizes it and to the load that disipates the energy passing through it. Each cell is maintained small compared to the shortest wavelength utilized to maintain proper characteristic impedance. Typically, for a 300 MHz frequency from generator 58 and an air dielectric between the plates of each cell 20, an electromagnetic energy transmission wavelength of approximately 1 meter is provided. A spacing of approximately 1/10 meter (wavelength) between the plates of each cell will make the width of each cell small compared to a wavelength.

Advantages of the system include EMR test fields being induced into the test specimens free of EMR reflections and resonances encountered in present test chambers. The EMR test field may be steered by phase shift or delay networks. This steering can provide directing of the EMR fields to impinge on the test specimens from selected angles. Expensive and clumsey positioners are not required. The EMR test system is extremely efficient, since most of the energy impinges directly on the test specimen. Emission of EMR from the system into the atmosphere is low, providing for eliminating or reducing electromagnetic interference problems and the need for frequency allocations. High level EMR fields can be generated utilizing low power amplifiers. The system provides for simplified tests of large systems. Multiple test chambers (multiple cell arrays) may be utilized with separate test specimens simultaneously.

Although the present invention has been described with reference to the preferred embodiments, workers skilled in the art will recognize that changes may be made in form and detail without departing from the spirit and scope of the invention. Accordingly the scope of the invention should be limited only by the claims appended hereto.

I claim:

1. An electromagnetic radiation test system for varying the degree of electromagnetic radiation generated in a bounded space, comprising: transmission line stripline cell means disposed to provide said bounded space for having said electromagnetic radiation generated therein, means for generating radio frequency voltage coupled to said stripline cell means for developing said electromagnetic radiation therein, load means coupled to said cell means for dissipating said radio frequency voltages after passage of said voltages through the stripline cell means, and an aperture through said stripline cell means for receiving an object to be subjected to said electromagnetic radiation.

2. An electromagnetic radiation test system as set forth in claim 1 wherein said transmission line stripline cell means is a plurality of strip transmission lines plates arranged in parallel planes, spaced apart and forming respective cells of said bounded space between adjacent pairs of said plates, said aperture being a substantially coaxial aperture through each of said plates.

3. An electromagnetic radiation test system as set forth in claim 2 wherein said plurality of strip transmission lines plates is two plates forming a single cell, said load means is a resistance load, and said means for generating radio frequency energy is a signal generator.

4. An electromagnetic radiation test system as set forth in claim 2 wherein said plurality of strip transmission line plates is four plates forming three stripline cells, with adjacent cells having a common plate therebetween, said load means comprises an impedance coupled between adjacent plates for providing a terminal load of the characteristic impedance for each cell, and further comprising a dielectric between respective plates and an insulating coating over the surface of said plates at said aperture for insulating said plates from any object placed in said aperture.

5. An electromagnetic radiation test system as set forth in claim 2 wherein said plurality of strip transmission lines plates form plural stripline cells with adjacent cells having a common plate therebetween providing physically and electrically coupling in series of a row of transverse electric field cells, the spacing between walls of each cell being approximately one-tenth of the wavelength applied thereto.

6. An electromagnetic radiation test system as set forth in claim 5 and further comprising a non-conductive coupling means connecting the output from said radio frequency voltage generating means to said plural stripline cells, and said radio frequency voltage generating means is a signal generator.

7. An electromagnetic radiation test system as set forth in claim 6 wherein said non-conductive coupling means includes a separate signal path from said signal generator to each pair of plates forming a cell, each of said non-conductive coupling means signal paths comprising, coupled in series, a light emitting diode circuit, fiber optics, a photodiode circuit and a transmitter; said signal generator having an output coupled to said light emitting diodes and said transmitter having an output coupled to said plates forming each cell; and wherein said transmitters are electrically isolated from each other so that the field developed in each cell joins as a wavefront with the adjacent cell field.

8. An electromagnetic radiation test system as set forth in claim 7 wherein each of said non-conductive coupling means signal paths further comprise a phase shifter connected between said signal generator and said light emitting diode circuit for coupling signals at different and variable phases to respective cells.

* * * * *